(12) United States Patent
Ohhashi et al.

(10) Patent No.: US 9,133,352 B2
(45) Date of Patent: Sep. 15, 2015

(54) SURFACE TREATMENT AGENT AND SURFACE TREATMENT METHOD

(71) Applicant: Tokyo Ohka Kogyo Co., Ltd., Kawasaki-shi (JP)

(72) Inventors: Takuya Ohhashi, Kawasaki (JP); Mai Sugawara, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 284 days.

(21) Appl. No.: 13/761,816

(22) Filed: Feb. 7, 2013

(65) Prior Publication Data

US 2013/0206039 A1 Aug. 15, 2013

(30) Foreign Application Priority Data

Feb. 10, 2012 (JP) .................. 2012-027136
Apr. 5, 2012 (JP) .................. 2012-086726

(51) Int. Cl.
| | |
|---|---|
| C07F 7/10 | (2006.01) |
| C09D 7/12 | (2006.01) |
| G03F 7/11 | (2006.01) |
| H01L 21/3105 | (2006.01) |
| H01L 21/027 | (2006.01) |
| H01L 21/306 | (2006.01) |
| H01L 21/321 | (2006.01) |
| G03F 7/075 | (2006.01) |
| H01L 21/02 | (2006.01) |

(52) U.S. Cl.
CPC ............ C09D 7/1233 (2013.01); G03F 7/0752 (2013.01); G03F 7/11 (2013.01); H01L 21/02057 (2013.01); H01L 21/0271 (2013.01); H01L 21/306 (2013.01); H01L 21/3105 (2013.01); H01L 21/321 (2013.01); *H01L 21/0217* (2013.01)

(58) Field of Classification Search
CPC ........................ C07F 7/1868; C09D 183/08
USPC ......................................... 556/410
See application file for complete search history.

(56) References Cited

U.S. PATENT DOCUMENTS

| | | | |
|---|---|---|---|
| 7,553,686 B2 * | 6/2009 | George et al. ............. | 438/48 |
| 2003/0021966 A1 * | 1/2003 | Segal et al. ............. | 428/209 |
| 2003/0021996 A1 * | 1/2003 | Gudimenko et al. ...... | 428/411.1 |
| 2009/0107713 A1 * | 4/2009 | Chinn et al. ............. | 174/260 |

FOREIGN PATENT DOCUMENTS

| | | |
|---|---|---|
| JP | H06-163391 A | 6/1994 |
| JP | H07-142349 A | 6/1995 |
| JP | H11-511900 A | 10/1999 |
| JP | 2002158223 A * | 5/2002 |
| JP | 2011-122137 A | 6/2011 |
| WO | WO 96/15861 A | 5/1996 |

* cited by examiner

*Primary Examiner* — Porfirio Nazario Gonzalez
*Assistant Examiner* — Kofi Adzamli
(74) *Attorney, Agent, or Firm* — Knobbe Martens Olson & Bear LLP

(57) ABSTRACT

A monosilane compound or bissilane compound of a specific structure having dimethylamino groups is contained in a surface treatment agent used in the hydrophobization treatment of substrate surfaces.

9 Claims, No Drawings

SURFACE TREATMENT AGENT AND SURFACE TREATMENT METHOD

This application claims priority to Japanese Patent Application No. 2012-027136, filed on Feb. 10, 2012; and Japanese Patent Application No. 2012-086726, filed on Apr. 5, 2012, the contents of which are incorporated herein by reference.

BACKGROUND OF THE INVENTION

1. Field of the Invention

The present invention relates to a surface treatment agent used in hydrophobization treatment of a substrate surface, and a surface treatment method using the same.

2. Related Art

In the production of semiconductor devices and the like, a lithography technique is applied when forming an inorganic pattern on a substrate. With this lithography technique, a photosensitive resin composition is used to provide a photosensitive resin layer on a substrate, then actinic radiation is selectively irradiated (exposed) to this, and a resin pattern (resist pattern) is formed on the substrate by performing a developing process. Then, an inorganic pattern is formed by etching the substrate with this resin pattern as a mask.

However, in recent years, trends in higher integration and miniaturization of semiconductor devices have grown, and thus progress towards miniaturization and higher aspect ratios of the inorganic patterns has advanced. However, a problem has arisen of so-called pattern collapse in the meantime. This pattern collapse is a phenomenon when forming several inorganic patterns on a substrate in parallel, in which adjacent patterns close in so as to lean on one another, and depending on the situation, the pattern becomes damaged and separate from the base. If such pattern collapse occurs, the desired product will not be obtained, thereby causing a decline in the yield and reliability of the product.

This pattern collapse is known to occur when drying a rinse liquid in a rinsing process after pattern formation, due to the surface tension of this rinse liquid. In fact, when the rinse liquid is removed in a drying step, stress based on the surface tension of the rinse liquid acts between patterns, whereby pattern collapse occurs.

Consequently, despite there having been numerous experiments thus far to prevent pattern collapse by adding a substance (isopropanol, fluorine-based surfactants, etc.) to the rinse liquid that causes the surface tension to decrease (e.g., refer to Patent Documents 1 and 2), the prevention of pattern collapse has been insufficient with the schemes of such rinse liquids.

Patent Document 1: Japanese Unexamined Patent Application, Publication No. H6-163391
Patent Document 2: Japanese Unexamined Patent Application, Publication No. H7-142349
Patent Document 3: Japanese Translation of PCT International Publication, Publication No. H11-511900
Patent Document 4: Japanese Unexamined Patent Application, Publication No. 2011-122137

SUMMARY OF THE INVENTION

Incidentally, although different from pattern collapse, hydrophobization treatment using a silylation agent such as hexamethyldisilazane (HMDS) (silylation treatment) has been performed on substrate surfaces prior to providing a photosensitive resin layer on the substrate, in order to improve the adhesion between a resin pattern to be a mask and a substrate surface and prevent partial loss of the resin pattern from the developing solution (for example, refer to "Summary of the Invention" of Patent Document 3).

The present inventors have tried hydrophobization treatment on various substrates using several silylation agents such as HMDS and N,N-dimethylaminotrimethylsilane (DMATMS), believing that the force acting between patterns in a drying step after a rinse process could be reduced and pattern collapse could be prevented if the surface of the inorganic pattern were hydrophobized with a silylation agent. However, although hydrophobization to a high degree was possible in a case of the material of the substrate surface being Si, the extent of hydrophobization was insufficient with any silylation agent in a case of the material of the substrate surface being TiN or SiN.

In addition, in a case of an inorganic pattern being formed by wet etching, the substrate surface may be treated with hydrofluoric acid; however, in this case, there is a tendency for hydrophobization of the substrate surface by the above-mentioned silylation agent to become more difficult. In the case of the material of the substrate surface being TiN or SiN, this tendency is considerable.

In response to such a problem, it has been known that a substrate having a surface material that is TiN or SiN can be hydrophobized using a cyclic silazane compound such as 2,2,5,5-tetramethyl-2,5-disila-1-azacyclopentane as the silylation agent (refer to Patent Document 4). However, in the case of using a cyclic silazane compound, it may be somewhat difficult to hydrophobize a substrate having a surface material that is silicon, which is widely used in the manufacture of semiconductor devices.

The present invention has been made taking such actual existing conditions into account, and has an object of providing a surface treatment agent that can hydrophobize to a high degree a substrate for which the material of the substrate surface is silicon, even in a case of the substrate surface being treated by hydrofluoric acid, and can hydrophobize to a high degree even in a case of the material of the substrate surface being TiN or SiN, as well as a surface treatment method using such a surface treatment agent.

In order to solve the above-mentioned problems, the present inventors have conducted extensive studies. As a result thereof, they have found that the above-mentioned problem could be solved by having a monosilane compound or bissilane compound of a specific structure having a dimethylamino group contained in a surface treatment agent to be used in the hydrophobization treatment of a substrate surface, thereby arriving at completion of the present invention. More specifically, the present invention provides the following.

According to a first aspect of the present invention, a surface treatment agent used in hydrophobization treatment of a substrate surface includes a compound represent by the following formula (1) or (2)

$$R^1{}_a Si[N(CH_3)_2]_{4-a} \quad (1)$$

in which, in formula (1), $R^1$ is each individually a straight chain or branched chain aliphatic hydrocarbon group with 1 to 18 carbon atoms in which a part or all hydrogen atoms may be substituted by fluorine atoms, and a is 1 or 2;

$$R^2{}_b[N(CH_3)_2]_{3-b}Si-R^4-SiR^3{}_c[N(CH_3)_2]_{3-c} \quad (2)$$

in which, in formula (2), $R^2$ and $R^3$ are each independently a hydrogen atom, or a straight chain or branched chain alkyl group with 1 to 4 carbon atoms, $R^4$ is a straight chain or branched chain alkylene group with 1 to 16 carbon atoms, and b and c are each independently an integer of 0 to 2.

According to a second aspect of the present invention, a surface treatment method includes exposing a substrate surface to the surface treatment agent as described in the first aspect to hydrophobize the substrate surface.

According to the present invention, it is possible to provide a surface treatment agent that can hydrophobize to a high degree a substrate for which the material of the substrate surface is silicon, even in a case of the substrate surface being treated by hydrofluoric acid, and can hydrophobize to a high degree even in a case of the material of the substrate surface being TiN or SiN, as well as a surface treatment method using such a surface treatment agent.

DETAILED DESCRIPTION OF THE INVENTION

Surface Treatment Agent

First, a surface treatment agent according to the present invention will be explained. The surface treatment agent according to the present invention is suitably used when hydrophobizing a substrate surface. Herein, a substrate used for semiconductor device manufacturing is exemplified as the "substrate". In addition, as well as the surface of the substrate itself, the surface of an inorganic pattern provided on the substrate, the surface of an inorganic layer that has not been patterned, or the like is exemplified as the "substrate surface".

As the inorganic pattern provided on the substrate, a pattern made by forming a resin pattern (resist pattern) on the surface of an inorganic layer present on the substrate using a lithography technique, and conducting an etching process on the inorganic layer with this resin pattern as a mask is exemplified. As well as the substrate itself, a film of an inorganic matter formed on the substrate surface or the like are exemplified as the inorganic layer.

In particular, the surface treatment agent according to the present invention is suitably used in a case of the material of the substrate surface being TiN or SiN, in addition to a case of the material of the substrate surface being silicon. Conventionally, with a silylation agent such as hexamethyldisilazane (HMDS) that has come to be used in the hydrophobization of substrate surfaces, or cyclic silazane compounds or the like, it has not been possible to achieve a high degree of hydrophobization of the substrate surface in both the case of the material of the substrate surface being silicon and the case of being TiN or SiN. However, according to the surface treatment agent of the present invention, it is possible to provide a surface treatment agent that can achieve a high degree of hydrophobization of the substrate surface in both the case of the material of the substrate surface being silicon and the case of being TiN or SiN, thereby enabling application to the hydrophobization of substrates consisting of a wide range of materials.

In addition, although there is a tendency for hydrophobization of a substrate surface to become difficult in a case of the substrate surface being treated with hydrofluoric acid, according to the surface treatment agent of the present invention, it is possible to suitably hydrophobize a substrate surface, even in the case of the substrate surface being treated with hydrofluoric acid.

Since the surface treatment agent according to the present invention is vaporized by a means such as heating and bubbling, the vaporized surface treatment agent may be used to perform surface treatment by being made to contact the surface of a substrate, and may be used to perform surface treatment by coating the surface of the substrate in liquid form by a means such as a spin-coating method or dipping method.

The surface treatment agent according to the present invention contains a compound represented by the following formula (1) or (2) as a silylation agent.

$$R^1_a Si[N(CH_3)_2]_{4-a} \quad (1)$$

In formula (1), $R^1$ each independently is a straight chain or branched chain aliphatic hydrocarbon group having 1 to 18 carbon atoms that may have a part or all of the hydrogen atoms substituted by fluorine atoms, and a is 1 or 2.

$$R^2_b[N(CH_3)_2]_{3-b}Si-R^4-SiR^3_c[N(CH_3)_2]_{3-c} \quad (2)$$

In formula (2), $R^2$ and $R^3$ are each independently a hydrogen atom or a straight chain or branched chain alkyl group with 1 to 4 carbon atoms, $R^4$ is a straight chain or branched chain alkylene group with 1 to 16 carbon atoms, and b and c are each independently integers of 0 to 2.

The surface treatment agent may include a plurality of compounds represented by formula (1) or (2), and may include a combination of compounds represented by formula (1) and compounds represented by formula (2). Hereinafter, the components contained in the surface treatment agent will be explained in detail.

Compound Represented by Formula (1) or (2)

The surface treatment agent according to the present invention contains a compound represented by the above formula (1) or (2) as a silylation agent. This compound represented by formula (1) or (2) is a component for silylating the substrate surface to raise the hydrophobicity of the substrate surface.

The surface treatment agent can also independently use a compound represented by formula (1) or (2), and can also use the compound represented by formula (1) or (2) diluted in an organic solvent described later. For this reason, the content of the compound represented by formula (1) or (2) in the surface treatment agent is not particularly limited so long as being in a range not inhibiting the object of the present invention.

(Compound Represented by Formula (1))

The compound represented by formula (1) contains as $R^1$ a straight chain or branched chain aliphatic hydrocarbon group with 1 to 18 carbon atoms in which a part or all hydrogen atoms may be substituted by fluorine atoms. The carbon number of $R^1$ is preferably 2 to 18, and more preferably 8 to 18. In addition, $R^1$ may be a saturated hydrocarbon group, or an unsaturated hydrocarbon group. In the case of $R^1$ being an unsaturated hydrocarbon group, the positions and number of unsaturated bonds are not particularly limited, and the unsaturated bond may be a double bond or a triple bond.

As examples in the case of $R^1$ being a straight chain or branched chain saturated hydrocarbon group unsubstituted by fluorine atoms, a methyl group, ethyl group, n-propyl group, isopropyl group, n-butyl group, sec-butyl group, tert-butyl group, isobutyl group, amyl group, isoamyl group, tert-amyl group, hexyl group, 2-hexyl group, 3-hexyl group, heptyl group, 2-heptyl group, 3-heptyl group, isoheptyl group, tert-heptyl group, n-octyl group, isooctyl group, tert-octyl group, 2-ethylhexyl group, nonyl group, isononyl group, decyl group, dodecyl group, tridecyl group, tetradecyl group, pentadecyl group, hexadecyl group, heptadecyl group, octadecyl group, and the like can be exemplified.

As examples in the case of $R^1$ being a straight chain or branched chain unsaturated hydrocarbon group unsubstituted by fluorine atoms, a vinyl group, 1-propenyl group, allyl group, isopropenyl group, 1-butenyl group, 2-butenyl group, 3-butenyl group, 1,3-butadienyl group, 1-ethylvinyl group, 1-methyl-1-propenyl group, 1-methyl-2-propenyl group, 4-pentenyl group, 1,3-pentadienyl group, 2,4-pentadienyl group, 3-methyl-1-butenyl group, 5-hexenyl group, 2,4-hexadienyl group, 6-heptenyl group, 7-octenyl group, 8-nonenyl group, 9-decenyl group, 10-undecenyl group, 11-dodecenyl group, 12-tridecenyl group, 13-tetradecenyl group, 14-pentadecenyl group, 15-hexadecenyl group, 16-heptadecenyl group, 17-octadecenyl group, ethynyl group, propargyl group, 1-propynyl group, 1-butynyl group, 2-butynyl group, 3-butynyl group, 1-pentynyl group, 2-pentynyl group, 3-pentynyl group, 4-pentynyl group, 1-hexynyl group, 2-hexynyl group, 3-hexynyl group, 4-hexynyl group, 5-hexynyl group, 6-heptynyl group, 7-octynyl group, 8-nonynyl group, 9-decynyl group, 10-undecynyl group, 11-dodecynyl group, 12-tridecynyl group, 13-tetradecynyl group, 14-pentadecynyl group, 15-hexadecynyl group, 16-heptadecynyl group, 17-octadecynyl group, and the like can be exemplified.

In the case of $R^1$ being a straight chain or branched chain aliphatic hydrocarbon group substituted by fluorine atoms, the substitution number and substitution positions of fluorine atoms are not particularly limited. The substitution number of fluorine atoms in the aliphatic hydrocarbon group is preferably at least 50% of the number of hydrogen atoms possessed by the aliphatic hydrocarbon group, more preferably at least 70%, and particularly preferably 80%.

Due to a superior hydrophobization effect being easily obtained, a straight chain aliphatic hydrocarbon group with 1 to 18 carbon atoms in which a part of all hydrogen atoms may be substituted by fluorine atoms is preferable as $R^1$. In addition, due to easily obtaining a surface treatment agent excelling in storage stability and the like, a straight chain saturated hydrocarbon group with 1 to 18 carbon atoms (alkyl group with 1 to 18 carbon atoms) in which a part or all hydrogen atoms may be substituted by fluorine atoms is more preferable as $R^1$.

In formula (1), a is 1 or 2, and preferably 1. This is because, in the case of a being 1, the hydrophobization effect for the case of the material of the substrate surface being TiN is particularly superior.

Hydrophobization by way of the compound represented by formula (1) occurs from $R^1$, which is the hydrophobic group, being introduced to the substrate surface by the reaction between the compound represented by formula (1) and the substrate surface. In the case of $R^1$ being a straight chain, it is considered that the hydrophobic group easily pack together on the substrate surface due to there being little steric hindrance, whereby a favorable hydrophobization effect tends to be obtained.

In addition, in the case of a being 1, the hydrophobic groups easily pack together at the substrate surface, due to R tending to be arranged perpendicular to the substrate surface. On the other hand, in the case of a being 2, steric hindrance tends to occur between like hydrophobic groups between the plurality of molecules of the compound represented by formula (1), whereby it is difficult for the hydrophobic groups to pack together at the substrate surface. For this reason, it is considered easier to obtain a favorable hydrophobization effect in the case of a being 1 than the case of a being 2.

(Compound Represented by Formula (2))

The compound represented by formula (2) contains a hydrogen atom or a straight chain or branched chain alkyl group with 1 to 4 carbon atoms as $R^2$ and $R^3$. $R^2$ and $R^3$ may be the same or may be different. As $R^2$ and $R^3$, a hydrogen atom or a straight chain or branched chain alkyl group with 1 to 3 carbon atoms is preferable, a hydrogen atom or a methyl group is more preferable, and a methyl group is particularly preferable. In the case of $R^2$ and $R^3$ being such groups, there will be little steric hindrance between the substrate and the compound represented by formula (2); therefore, the compound represented by formula (2) will tend to suitably react with the substrate surface.

As specific examples for the case of $R^2$ and $R^3$ being straight chain or branched chain alkyl groups with 1 to 4 carbon atoms, a methyl group, ethyl group, n-propyl group, isopropyl group, n-butyl group, sec-butyl group, tert-butyl group and isobutyl group can be exemplified.

The compound represented by formula (2) contains a straight chain or branched chain alkylene group with 1 to 16 carbon atoms as $R^4$. The carbon number of the straight chain or branched chain alkylene group that is $R^4$ is preferably 1 to 10, and more preferably 2 to 8. It should be noted that straight chain alkylene group is a methylene group or α,ω-straight chain alkylene group, and branched alkylene group is an alkylene group other than a methylene group and α,ω-straight chain alkylene group. Since $R^4$ acts as a hydrophobic group, the substrate surface is hydrophobized by the compound represented by formula (2) reacting with the substrate surface. In the case of $R^4$ being a straight chain or branched chain alkylene with such a carbon number, the compound represented by formula (2) and the substrate surface will tend to be allowed to react suitably, whereby the substrate surface will tend to be suitably hydrophobized.

In addition, it is preferable for $R^4$ to be a straight chain alkylene group. In the case of $R^4$ being a straight chain alkylene group, there will be little steric hindrance between the compounds represented by formula (2); therefore, the compound represented by formula (2) tends to bond to the substrate surface in a state where the $R^4$ being the hydrophobic groups are packed together.

As examples for the case of $R^4$ being a straight chain or branched chain alkylene group with 1 to 16 carbon atoms, a methylene group, 1,2-ethylene group, 1,1-ethylene group, propane-1,3-diyl group, propane-1,2-diyl group, propane-1,1-diyl group, propane-2,2-diyl group, butane-1,4-diyl group, butane-1,3-diyl group, butane-1,2-diyl group, butane-1,1-diyl group, butane-2,2-diyl group, butane-2,3-diyl group, pentane-1,5-diyl group, pentane-1,4-diyl group, hexane-1,6-diyl group, heptane-1,7-diyl group, octane-1,8-diyl group, 2-ethylhexane-1,6-diyl group, nonane-1,9-diyl group, decane-1,10-diyl group, undecane-1,11-diyl group, dodecane-1,12-diyl group, tridecane-1,13-diyl group, tetradecane-1,14-diyl group, pentadecane-1,15-diyl group, hexadecane-1,16-diyl group and the like can be exemplified.

In the compound represented by formula (2), b and c are each independently an integer of 0 to 2. For the compound represented by formula (2), b and c are preferably 1 or 2, and more preferably 2 due to synthesis and handling being easy.

(Organic Solvent)

The surface treatment agent according to the present invention may further contain an organic solvent. By diluting the compound represented by formula (1) or (2) with an organic solvent, it is possible to improve the coating workability on the substrate surface, handling ability, displaceability with the rinse liquid, etc.

So long as being able to dissolve the compound represented by formula (1) or (2) without causing reaction with the compound represented by formula (1) or (2), and causing little damage to the substrate surface, a conventional well-known organic solvent can be used as this organic solvent without being particularly limited.

More specifically, sulfoxides such as dimethylsulfoxide; sulfones such as dimethylsulfone, diethylsulfone, bis(2-hydroxyethyl)sulfone and tetramethylenesulfone; amides such as N,N-dimethylformamide, N-methylformamide, N,N-dimethylacetamide, N-methylacetamide and N,N-diethylacetamide; lactams such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones such as 1,3-dimethyl-2-imidazolidinone, 1,3-diethyl-2-imidazolidinone and 1,3-diisopropyl-2-imidazolidinone; (poly)alkylene glycol dialkyl ethers such as ethylene glycol dimethyl ether, ethylene glycol diethyl ether, diethylene glycol dimethyl ether, diethylene glycol methyl ethyl ether, diethylene glycol diethyl ether and triethylene glycol dimethyl ether; (poly)alkylene glycol alkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate and propylene glycol monoethyl ether acetate; other esters such as tetrahydrofuran; ketones such as methyl ethyl ketone, cyclohexanone, 2-heptanone and 3-heptanone; alkyl lactate esters such as 2-hydroxypropanoic acid methyl and 2-hydroxypropanoic acid ethyl; other esters such as 3-methoxypropanoic acid methyl, 3-methoxypropanoic acid ethyl, 3-ethoxypropanoic acid methyl, 3-ethoxypropanoic acid ethyl, ethoxyacetic acid ethyl, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate and ethyl 2-oxobutanoate; lactones such as β-propiolactone, γ-butyrolactone and δ-pentyrolactone; straight chain, branched chain or cyclic hydrocarbons such as n-hexane, n-heptane, n-octane, n-nonane, methyloctane, n-decane, n-undecane, n-dodecane, 2,2,4,6,6-pentamethyl heptane, 2,2,4,4,6,8,8-heptamethyl nonane, cylcohexane and methylcyclohexane; aromatic hydrocarbons such as benzene, toluene, naphthalene and 1,3, 5-trimethyl benzene; terpenes such as p-menthane, diphenyl methane, limonene, terpinene, bornane, norbornane and pinane; and the like can be exemplified. These organic solvents can be used individually or by mixing at least two thereof.

Among these, straight chain, branched chain or cyclic hydrocarbons are preferable due to having high hydrophobicity and tending to suppress reaction between the compound represented by formula (1) or (2) contained in the surface treatment agent and the moisture in air.

In the case of diluting the compound represented by formula (1) or (2) with organic solvent, the concentration of the compound represented by formula (1) or (2) in the diluted liquid is preferably 0.1 to 99.9% by mass in the surface treatment agent, more preferably 1 to 50% by mass, even more preferably 1 to 30% by mass, and particularly preferable 3 to 20% by mass. By setting the content of the compound represented by formula (1) or (2) in the surface treatment agent to the above range, in addition to the surface treatment effect being maintained, it is possible to improve the coating workability on the substrate surface, handling property, displaceability with rinse liquid, etc.

The timing at which the compound represented by formula (1) or (2) is diluted with organic solvent is not particularly limited. For example, the compound represented by formula (1) or (2) may be stored while diluted in organic solvent in advance, or may be configured so as to dilute the compound represented by formula (1) or (2) in organic solvent immediately before treating the substrate surface using the surface treatment agent.

Surface Treatment Method

Next, a surface treatment method according to the present invention will be explained. The surface treatment method according to the present invention exposes a substrate surface to the surface treatment agent according to the present invention, and treats the surface of this substrate.

The surface treatment method according to the present invention hydrophobizes a substrate surface, and the object of this treatment may be anything; however, as a representative example of the object of this treatment, (1) to hydrophobize a substrate surface to improve the adhesion to a resin pattern composed of photoresist or the like, and (2) to prevent pattern collapse of an inorganic pattern on a substrate surface in a drying step after rinsing can be given.

In the case of having the above-mentioned (1) as an object, prior to forming a photosensitive resin layer on the substrate surface, for example, the surface of the substrate may be exposed to the surface treatment agent according to the present invention. As the method of exposing the substrate surface to the surface treatment agent according to the present invention, a conventional well-known method can be used without being particularly limited. For example, a method of vaporizing the surface treatment agent according to the present invention to form vapor and causing this vapor to contact the substrate surface, a method of causing the surface treatment agent according to the present invention to contact the substrate surface by a spin-coating method, immersion method, etc. can be exemplified. Since the hydrophobicity of the substrate surface is improved by such an operation, the adhesion to a photosensitive resin layer or the like is improved.

In the case of having the above-mentioned (2) as an object, prior to performing post-rinse process drying after an inorganic layer has been formed, the substrate surface may be exposed to the surface treatment agent according to the present invention.

The reason that pattern collapse of an inorganic pattern on a substrate surface can be prevented in a drying step after rinsing by conducting such a surface treatment will be explained.

When forming an inorganic pattern on a substrate surface, dry etching or wet etching is performed, for example. In pattern formation by dry etching, dry etching is performed by way of a halogen series gas or the like, then etching residue such as particles and metallic impurities is washed with SC-1 (ammonia/hydrogen peroxide solution), SC-2 (hydrochloric acid/hydrogen peroxide solution), or the like. Then, after rinsing using a rinse liquid such as water and isopropanol, the surface of the inorganic pattern is dried by air drying, spin drying, or the like. On the other hand, in pattern formation by wet etching, wet etching is performed using DHF (dilute hydrofluoric acid), BHF (hydrofluoric acid/ammonium fluoride), SPM (sulfuric acid/hydrogen peroxide solution), APM (ammonia/hydrogen peroxide solution), or the like, and after rinsing using a rinse liquid such as water and isopropanol, the surface of the inorganic pattern is dried by air drying, spin drying, or the like.

It should be noted that a method such as that described starting from paragraph 0030 of Japanese Patent No. 3866130, for example, is acceptable as the drying process.

In the surface treatment method according to the present invention, prior to drying such an inorganic pattern, the inorganic pattern surface is hydrophobized by treating with the surface treatment agent according to the present invention. In particular, prior to rinse by a rinse liquid, the inorganic pattern surface is hydrophobized by treating with the surface treatment agent according to the present invention.

Herein, the force F acting between the patterns of the inorganic pattern in the drying step after rinsing is represented as in the following formula (1). In the formula, γ represents the surface tension of the rinse liquid, θ represents the contact angle of the rinse liquid, A represents the aspect ratio of the inorganic pattern, and D represents the distance between the inorganic pattern side walls.

$$F = 2\gamma \cdot \cos\theta \cdot A/D \quad (1)$$

Therefore, if the surface of the inorganic pattern can be hydrophobized and the contact angle of the rinse liquid increased (cos θ reduced), the force acting between the inorganic patterns in the drying step following rinsing can be reduced, and thus pattern collapse can be prevented.

This surface treatment is performed by immersing the substrate on which an inorganic pattern has been formed into the surface treatment agent, or by coating or spraying the surface treatment agent onto the inorganic pattern. The treatment time is preferably 10 seconds to 60 minutes.

It should be noted that, prior to treating the inorganic pattern surface with the surface treatment agent, it is preferable to displace the DHF (dilute hydrofluoric acid), BHF (hydrofluoric acid/ammonium fluoride), etc. used in the formation of the inorganic pattern with a water-soluble organic solvent such as isopropanol. The displaceability with the surface treatment agent thereby improves, and the hydrophobicity improving effect increases.

It should be noted that, from the point of throughput, it is preferable for the surface treatment and rinse treatment to be consecutive treatments. For this reason, as the surface treatment agent, it is preferable to select one superior in displaceability with the rinse liquid. In this regard, in a case of using a water-based liquid as the rinse liquid, it is preferable for the surface treatment agent to contain an organic solvent as an abundant component. This is because, by containing an organic solvent as an abundant component, the displaceability of the surface treatment agent with the rinse liquid will improve.

EXAMPLES

Although the present invention will be explained more specifically by way of Examples hereinafter, the present invention is not to be limited to the following Examples.

Examples 1 to 9 and Comparative Examples 1 to 8

Surface treatment agents consisting of 5% by mass of the silylation agents listed in Tables 1 to 4 and 95% by mass of n-decane were used. Substrates of the surface materials listed in Tables 1 to 4 were washed with a 1% by mass hydrogen fluoride aqueous solution at 25° C. for 1 minute, followed by dipping for 60 seconds in the surface treatment agent at room temperature. Then, the substrate surface was rinsed with methyl ethyl ketone, and made to dry by way of blowing nitrogen thereon. Thereafter, using a Dropmaster 700 (Kyowa Interface Science Co., Ltd.), a droplet of pure water (1.8 μL) was dropped on the substrate surface, and the contact angle was measured 10 seconds after dropping. The results are shown in Tables 1 to 4.

Reference Example 1 and Reference Example 2

The contact angle for a substrate on which treatment using hydrofluoric acid and treatment using the surface treatment agent had not been conducted serving as Reference Example 1 was measured similarly to Example 1. In addition, the contact angle for a substrate on which treatment using hydrofluoric acid had been conducted and treatment using the surface treatment agent had not been conducted serving as Reference Example 2 was measured similarly to Example 1. The contact angles of the respective substrates measured in Reference Example 1 and Reference Example 2 are shown in Table 1.

TABLE 1

|  | Ref. ex. 1 | Ref. ex. 2 | Ex. 1 | Ex. 2 | Ex. 3 | Ex. 4 |
|---|---|---|---|---|---|---|
| Silylation agent | — | — | 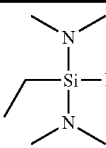 | 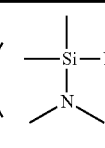 | 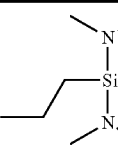 | 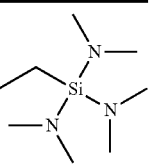 |
| Surface material of substrate | | | | | | |
| Silicon | 4.2° | 74.3° | 98.8° | 91.4° | 96.4° | 97.8° |
| Silicon nitride | 43.6° | 37.1° | 95.1° | 90.0° | 88.5° | 95.9° |
| Titanium nitride | 52.5° | 4.2° | 93.0° | 17.8° | 96.3° | 118.8° |

TABLE 2

| | Ex. 5 | Ex. 6 | Ex. 7 |
|---|---|---|---|
| Silylation agent | (structure) | (structure) | (structure) |
| Surface material of substrate | | | |
| Silicon | 93.2° | 91.5° | 98.2° |
| Silicon nitride | 89.2° | 92.8° | 82.5° |
| Titanium nitride | 111.1° | 115.1° | 88.1° |

TABLE 3

| | Ex. 8 | Ex. 9 | Comp. ex. 1 | Comp. ex. 2 | Comp. ex. 3 |
|---|---|---|---|---|---|
| Silylation agent | (structure) | (structure) | (structure) | (structure) | (structure) |
| Surface material of substrate | | | | | |
| Silicon | 101.0° | 85.0° | 86.2° | 78.5° | 89.2° |
| Silicon nitride | 80.3° | 71.8° | 64.8° | 89.1° | 73.9° |
| Titanium nitride | 94.9° | 103.4° | 12.2° | 44.5° | 11.7° |

TABLE 4

| | Comp. ex. 4 | Comp. ex. 5 | Comp. ex. 6 | Comp. ex. 7 | Comp. ex. 8 |
|---|---|---|---|---|---|
| Silylation agent | (structure) | (structure) | (structure) | (structure) | (structure) |
| Surface material of substrate | | | | | |
| Silicon | 88.3° | 82.3° | 82.0° | 76.9° | 81.2° |
| Silicon nitride | 35.8° | 70.5° | 65.2° | 43.4° | 78.3° |
| Titanium nitride | 8.6° | 25.0° | 15.9° | 19.4° | 57.1° |

It has been found from Example 1 and Examples 3 to 6 that a substrate having a surface material that is SiN (silicon nitride) and TiN (titanium nitride) can be suitably hydrophobized by a surface treatment agent containing a monosilane compound in which three dimethylamino groups and an aliphatic hydrocarbon group bind to a silicon atom. In addition, it has been found that the surface of a silicon substrate can be suitably hydrophobized according to the surface treatment agents of Example 1 and Examples 3 to 6.

It has been found from Example 2 that a substrate having a surface material that is SiN can be suitably hydrophobized by a surface treatment agent containing, as the silylation agent, bis(dimethylamino)dimethylsilane, which is a monosilane compound in which two dimethylamino groups and two methyl groups bind to a silicon atom. In addition, it is found that the surface of a silicon substrate can be suitably hydrophobized according to the surface treatment agent of Example 2.

It has been found from Examples 7 to 9 that a substrate having a surface material that is SiN can be suitably hydrophobized by a surface treatment agent containing, as the silylation agent, a bissilane compound in which dimethylamino groups bind to two respective silicon atoms, and two silicon atoms are connected by an alkylene group with 2 to 8 carbon atoms. In addition, it has been found that the surface of a silicon substrate can be suitably hydrophobized according to the surface treatment agents of Examples 7 to 9.

In addition, it has been found from Examples 1 to 9 that even a substrate that had been surface treated using hydrofluoric acid is suitably hydrophobized according to the surface treatment agents of Examples 1 to 9.

What is claimed is:

1. A surface treatment agent used in hydrophobization treatment of a substrate surface, the surface treatment agent comprising a compound represented by the following formula (1) or (2)

$$R^1_a Si[N(CH_3)_2]_{4-a} \quad (1)$$

wherein, in formula (1), $R^1$ is a straight chain or branched chain aliphatic hydrocarbon group having 2 to 18 carbon atoms in which some or all of the hydrogen atoms may be substituted with fluorine atoms, and a is 1;

$$R^2_b[N(CH_3)_2]_{3-b}Si-R^4-SiR^3_c[N(CH_3)_2]_{3-c} \quad (2)$$

wherein, in formula (2), $R^2$ and $R^3$ are each independently a hydrogen atom, or a straight chain or branched chain alkyl group having 1 to 4 carbon atoms, $R^4$ is a straight chain or branched chain alkylene group selected from the group consisting of a propane-1,3-diyl group, propane-1,2-diyl group, propane-1,1-diyl group, propane-2,2-diyl group, butane-1,4-diyl group, butane-1,3-diyl group, butane-1,2-diyl group, butane-1,1-diyl group, butane-2,2-diyl group, butane-2,3-diyl group, pentane-1,5-diyl group, pentane-1,4-diyl group, hexane-1,6-diyl group, heptane-1,7-diyl group, octane-1,8-diyl group, 2-ethylhexane-1,6-diyl group, nonane-1,9-diyl group, decane-1,10-diyl group, undecane-1,11-diyl group, dodecane-1,12-diyl group, tridecane-1,13-diyl group, tetradecane-1,14-diyl group, pentadecane-1,15-diyl group and hexadecane-1,16-diyl group, and b and c are each independently an integer of 1 or 2.

2. The surface treatment agent according to claim 1, wherein $R^1$ is a straight chain aliphatic hydrocarbon group having 2 to 18 carbon atoms.

3. The surface treatment agent according to claim 2, wherein $R^1$ is a straight chain alkyl group having 2 to 18 carbon atoms.

4. The surface treatment agent according to claim 1, wherein b and c are 1.

5. The surface treatment agent according to claim 1, wherein $R^4$ is a straight chain alkylene group.

6. The surface treatment agent according to claim 1, wherein $R^2$ and $R^3$ are a hydrogen atom or methyl group.

7. The surface treatment agent according to claim 1, further comprising a solvent.

8. A surface treatment method, comprising exposing a substrate surface to the surface treatment agent according to claim 1 to hydrophobize the substrate surface.

9. A surface treatment method, comprising exposing a substrate surface to a surface treatment agent comprising a compound represented by the following formula (1) or (2) to hydrophobize the substrate surface, wherein a material of the substrate surface is silicon nitride or titanium nitride:

$$R^1_a Si[N(CH_3)_2]_{4-a} \quad (1)$$

wherein, in formula (1), each $R^1$ is independently a straight chain or branched chain aliphatic hydrocarbon group having 1 to 18 carbon atoms in which a some or all of the hydrogen atoms may be substituted by fluorine atoms, and a is 1 or 2;

$$R^2_b[N(CH_3)_2]_{3-b}Si-R^4-SiR^3_c[N(CH_3)_2]_{3-c} \quad (2)$$

wherein, in formula (2), $R^2$ and $R^3$ are each independently a hydrogen atom, or a straight chain or branched chain alkyl group with 1 to 4 carbon atoms, $R^4$ is a straight chain or branched chain alkylene group with 1 to 16 carbon atoms, and b and c are 2.

* * * * *